United States Patent
Garg et al.

(10) Patent No.: US 8,791,742 B2
(45) Date of Patent: Jul. 29, 2014

(54) DISTRIBUTED RESONATE CLOCK DRIVER

(71) Applicant: Broadcom Corporation, Irvine, CA (US)

(72) Inventors: Adesh Garg, Aliso Viejo, CA (US); Jun Cao, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/622,223

(22) Filed: Sep. 18, 2012

(65) Prior Publication Data

US 2014/0055180 A1    Feb. 27, 2014

Related U.S. Application Data

(60) Provisional application No. 61/693,155, filed on Aug. 24, 2012.

(51) Int. Cl.
*G06F 1/04* (2006.01)

(52) U.S. Cl.
USPC .......................... 327/299; 327/399; 327/291

(58) Field of Classification Search
USPC .......................................................... 327/168
See application file for complete search history.

(56) References Cited

U.S. PATENT DOCUMENTS

| | | | | |
|---|---|---|---|---|
| 7,683,691 B2 * | 3/2010 | Kumata | ......................... | 327/292 |
| 2006/0103418 A1 * | 5/2006 | Hargrove et al. | ............... | 326/21 |
| 2008/0061828 A1 * | 3/2008 | Zhang | ............................ | 326/83 |
| 2008/0150606 A1 * | 6/2008 | Kumata | ........................ | 327/292 |

FOREIGN PATENT DOCUMENTS

JP    2006235452 A  *  9/2006  ............... G09G 3/36

OTHER PUBLICATIONS

Broadcom Press Release, "Broadcom Announces Industry's Lowest Power, Highest Performance 100GbE Multi-Rate Gearbox PHYs," retrieved May 30, 2012, from http://www.broadcom.com/press/release.php?id=s669542 (2 pages).
Broadcom, "100-GbE/OTN/ VSR28 to CAUI Gearbox," retrieved May 30, 2010, from http://www.broadcom.com/products/Physical-Layer/Optical-Transport-Prod . . . (1 page).
Heydari, Payam, et al., "Design of Ultra High-Speed CMOS CML buffers and Latches," Proceedings of the 2003 International Symposium on Circuits and Systems, 2003 (4 pages).
Lightwave, "Broadcom intros 100GbE multi-rate gearbox PHYs," retrieved May 30, 2012, from http://www.lightwaveonline.com/articles/2015/05/broadcom-intros-100gbe- . . . (2 pages).
Winterling, Peter, "OTN paves the way for the transport medium of the future—Requirements for measuring equipment," JDS Uniphase Corporation, Nov. 2009 (10 pages).

* cited by examiner

*Primary Examiner* — Ryan Jager
(74) *Attorney, Agent, or Firm* — Brinks Gilson & Lione

(57) ABSTRACT

A clock driver includes a clock interconnect running to multiple lanes of an integrated circuit chip, the interconnect including a positive clock line and a negative clock line. A clock generator generates a clock signal and a source inductor, through which the clock generator draws DC power, helps drive the clock signal down the interconnect. The source inductor may be tunable. A distributed (or tunable) inductor is connected to and positioned along the positive and negative clock lines between the source inductor and an end of the interconnect. Multiple distributed inductors may be positioned and optionally tuned such as to create a resonant response in the clock signal with substantially similar quality and amplitude as delivered to the multiple lanes. Any of the distributed and source inductors may be switchable to change inductance of the distributed inductors and thus change the clock frequency in the lanes for different communication standards.

20 Claims, 7 Drawing Sheets under # US 8,791,742 B2

DISTRIBUTED RESONATE CLOCK DRIVER

REFERENCE TO EARLIER FILED APPLICATION

This application claims the benefit under 35 U.S.C. §119(e) of U.S. Provisional Patent Application No. 61/693,155, filed Aug. 24, 2012, and titled "DISTRIBUTED RESONATE CLOCK DRIVER," which is incorporated, in its entirety, by this reference.

1. TECHNICAL FIELD

This disclosure relates to clock distribution to multiple lanes on an integrated circuit chip, and more particularly, to the distribution of a high-speed clock over large distances on a chip to multiple lanes while minimizing power consumption and delivering a clock signal of substantially similar amplitude and quality to all lanes.

2. BACKGROUND

Rapid advances in electronics and communications technologies, driven by immense customer demand, have resulted in the widespread adoption of data-driven devices, including personal computers and mobile communication devices, including laptops, mobile phones, smart phones and global positioning devices (GPSs). The demand has increased the requirements for data centers to receive, store and transmit large amounts of data and at higher speeds to support the ever-increasing bandwidth requirements from these communications technologies. The demand has, therefore, created a corresponding demand for higher bandwidth and higher speed transfer of data through networks, and the physical ports and devices of those networks that carry the data. As an additional challenge, many devices transfer data according to different communications standards, so the physical ports and devices of communications networks need to transmit and receive in different modes that support all of these standards.

BRIEF DESCRIPTION OF THE DRAWINGS

The innovation may be better understood with reference to the following drawings and description. In the figures, like reference numerals designate corresponding parts throughout the different views.

DETAILED DESCRIPTION

Figure 1:
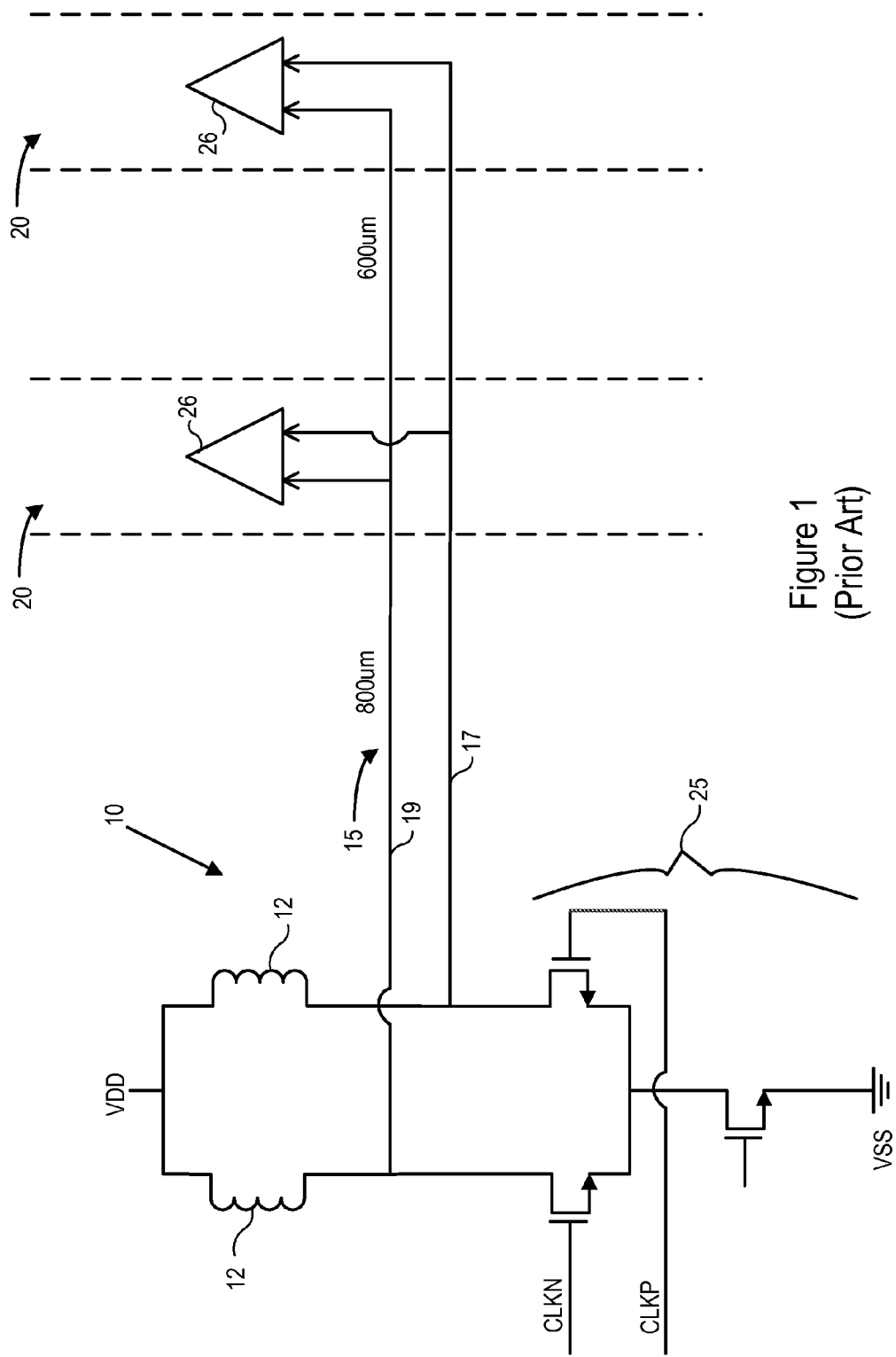
FIG. 1 is an example circuit showing use of a source inductor to drive a clock interconnect to multiple lanes.

The discussion below makes reference to the distribution of a clock. The clock may be one that is generated on an integrated circuit chip and that is distributed to multiple destinations via lines or interconnects. Any distribution connection to a destination may be referred to as a lane. The clock may be generated in any manner, such as through a phase lock loop (PLL) circuit and may be distributed to one or more of multiple lanes. The chips on which the present innovations may be implemented may use or even require high-speeds and support of multiple communications standards, and thus support multiple clock rates for transfer of data at different rates. The increase in number of lanes may require an ever-increasing distribution of the clock over larger distances.

The present application may be implemented in any circuit device for any reason, but particularly may be implemented in circuits that include a clock distribution or network. Further by way of example, the disclosed innovations may be applied to circuits where the clock is distributed over a large distance and at high frequencies to multiple destinations. By way of non-limiting example, the present application may be implemented within serializers/deserializers (SerDes) and in any SerDes with multi-lane transceivers. Such SerDes devices may be found, for instance, in networking or other data transport technologies related to or supporting the Ethernet, optical networks (short or long haul), in coherent optical systems and specifically in transceivers and receivers thereof. The innovations may be implemented in any other devices with any other purposes.

A SerDes may include a pair of functional blocks generally referred to as multiplexers and demultiplexers for high speed communications that compensate for limited bandwidth capability. These blocks convert data between serial data and parallel interfaces in each direction. For instance, a SerDes multiplexer converts data presented in parallel to being presented serially and a SerDEs demultiplexer converts data presented in serial to being presented in parallel, for corresponding processing on an integrated circuit. The term "SerDes" may also generically refer to interfaces used in various technologies and applications.

Accordingly, a multiplexer may include multiple data lines at an input and a single data line as an output. The ratio can be any ratio such as four too one or ten to one, for example. Likewise, a demultiplexer may include a single data line at an input and multiple lines at an output. The ratio can be any ratio such as one to six or one to twelve, for example. A demultiplexer may use an internal or external phase-locked loop (PLL) to multiply an incoming clock up to a desired frequency.

By way of example, the assignee of the present application has developed high-performance, multi-rate 100 Gigabit Ethernet (GbE) physical layer transceivers (PHYs) for a next-generation data center and core network equipment. These PHYs extend a portfolio of 10 GbE and 40 GbE to 100 GbE physical layer devices with the ability to multiplex and demultiplex data across four 25-Gbps SerDes lanes to (or from) ten 10-Gbps SerDes lanes. The devices can be configured to support four bi-directional lanes at 10 Gbps for 40

GbE repeater applications, support Ethernet and optical transport networking and are compliant with the IEEE 802.3ba standard for 100 GbE and international telecommunication union (ITU) optical line termination (OTL) 4.4 signaling. The disclosed innovations may be implemented in any other devices with any other purposes, and reference to the PHYs are merely by way of example.

These multi-lane devices include lanes that stretch over large distances on chip, creating a power consumption challenge. The multi-lane devices also create a challenge with delivering a clock signal to all lanes, regardless of distance, with a substantially similar amplitude and quality to deliver a consistent clock signal to all lanes. Where reference is being made to "delivering" the clock signal or clock interconnect, the clock interconnect may be connected directly to the lanes or indirectly connected through one or more other components (such as a buffer or amplifier) to the lanes. Additionally, the multi-lane devices may be configured with a multi-rate interface to cover a wide frequency range for multi-standard support, and thus adjustments to the clock signal across multiple lanes may be made to account for different clock rates. The adjustments to the clock signal may be pre-programmed and be executed to adjust the clock frequency with the flip of a physical or electronic switch.

FIG. 1 is an example circuit 10 that uses source inductors 12 to drive a clock interconnect 15 to multiple lanes 20. The source inductors 12 draw DC power through VDD (power) to drive the clock interconnect 15. The clock interconnect 15 may further include a positive clock signal line 17 (CLKP) and a negative clock signal line 19 (CLKN). A clock interconnect 15 may drive receiving (Rx) lanes and another clock interconnect 15 may drive transmission (Tx) lanes by way of example.

A phase-locked loop (PLL) circuit 24 (FIG. 6) may be used to generate a clock signal. A current-mode logic (CML) buffer 25 or other type of buffer may be located between the PLL and the clock interconnect 15 and may be integrated as part of a PLL circuit. The PLL 24 and CML buffer 25 may be referred to jointly as a clock generator. The example in FIG. 1 shows a distance of 800 um to the first lane 20 and 600 um between the first lane to the next lane 20. However, these distances are examples only to indicate some potential distances to the lanes 20. The distances may be any other lengths.

Where high frequency clocks are traveling large distances, the buffer 25 seeks to accurately model the interconnect 15 lines that connect to the lanes 20. The interconnect 15 may be a copper line or some other metal wire connecting the clock generator to the lanes 20. These metal lines can be modeled with resistance, capacitance and inductance or a combination of these electrical components, so as to account for electrical imperfections of the metal lines while seeking to establish a resonant, consistent-amplitude clock signal down the entirety of the lines. The effects from line resistance, capacitance and inductance may increase with longer metal lines as distances to the lanes 20 increases. For instance, the inductance of the source inductor 12 may be proportional or smaller than the line inductance of the interconnect. Failure to accurately model the interconnect changes the overall frequency response.

Furthermore, due to the lossy nature of the clock interconnect 15, the amplitude of the clock signal may significantly degrade from lane to lane. Signal degradation creates a larger power overhead since either the local clock buffer 26 needs to amplify the losses of the interconnect 15 or a larger amplitude needs to be launched from the source of the clock.

Figure 2:
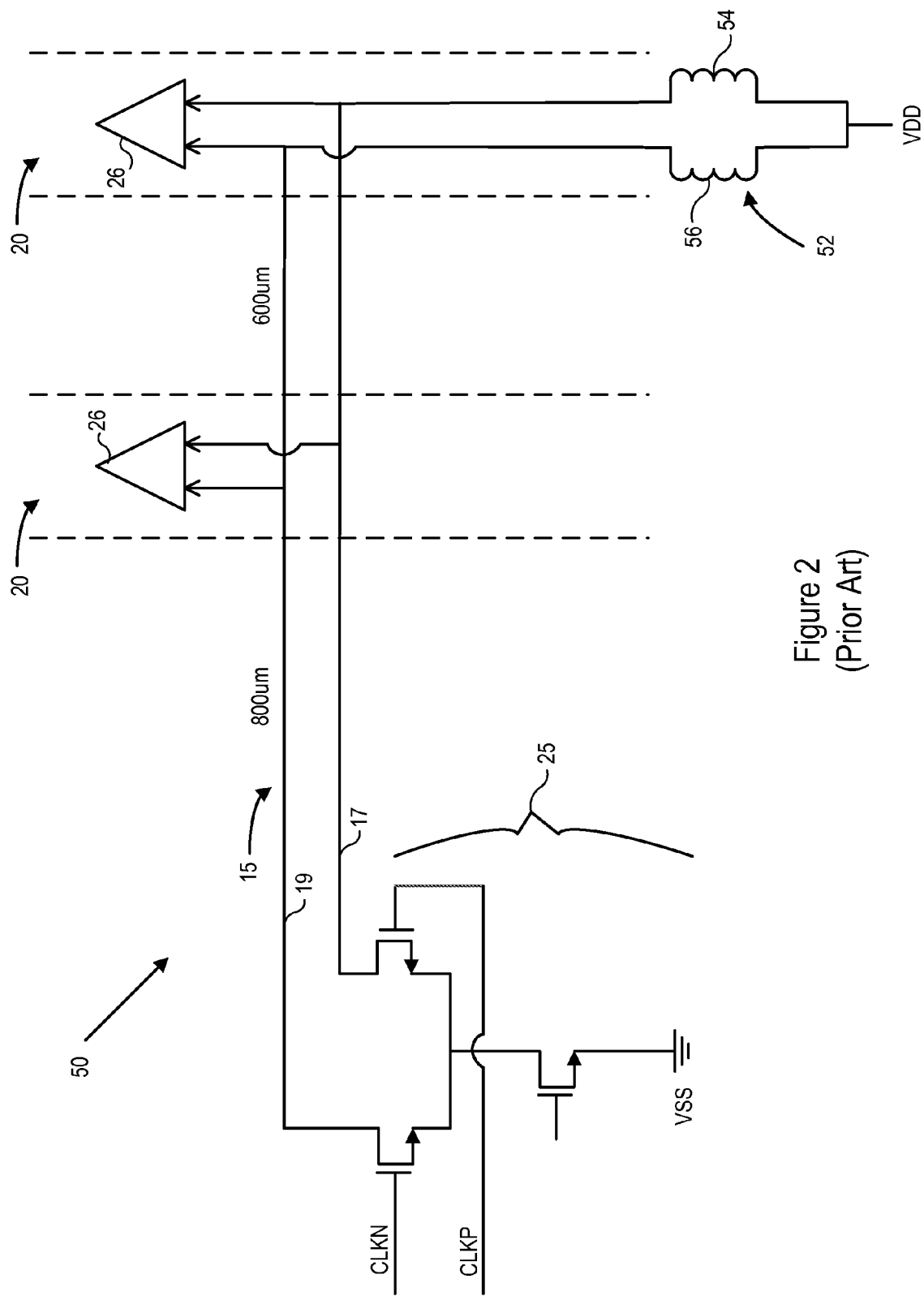
FIG. 2 is an example circuit showing use of a destination inductor to drive the clock interconnect to multiple lanes.

FIG. 2 is an example circuit 50 showing use of a destination inductor 52, including a positive line inductor 54 and a negative line inductor 56, to drive the clock interconnect 15 to multiple lanes 20. Circuit 50 places the source inductor 12 displayed in FIG. 1 at the end of the clock interconnect 15 as a destination inductor 52. Note that the destination inductor 52 of FIG. 2 is being powered (VDD) at the end of the clock interconnect 15. Doing so may mean that the inductor 52 takes on the interconnect model in contrast to the CML buffer 25 as discussed with reference to FIG. 1. Placing the inductor and VDD at the destination does not, however, alleviate the need to accurately model the inductance of the clock interconnect 15 and provide consistent amplitude of the clock interconnect 15 into the lanes 20.

The circuits 10 and 50 may create varying amplitude differences in the clock signal throughout a length of the clock interconnect 15 due to inaccurate modeling of the inductance of the positive and negative clock signal lines 17 and 19. The modeling is, therefore, an added complexity that can be a source of error with respect to the clock signal frequency response.

Figure 3:
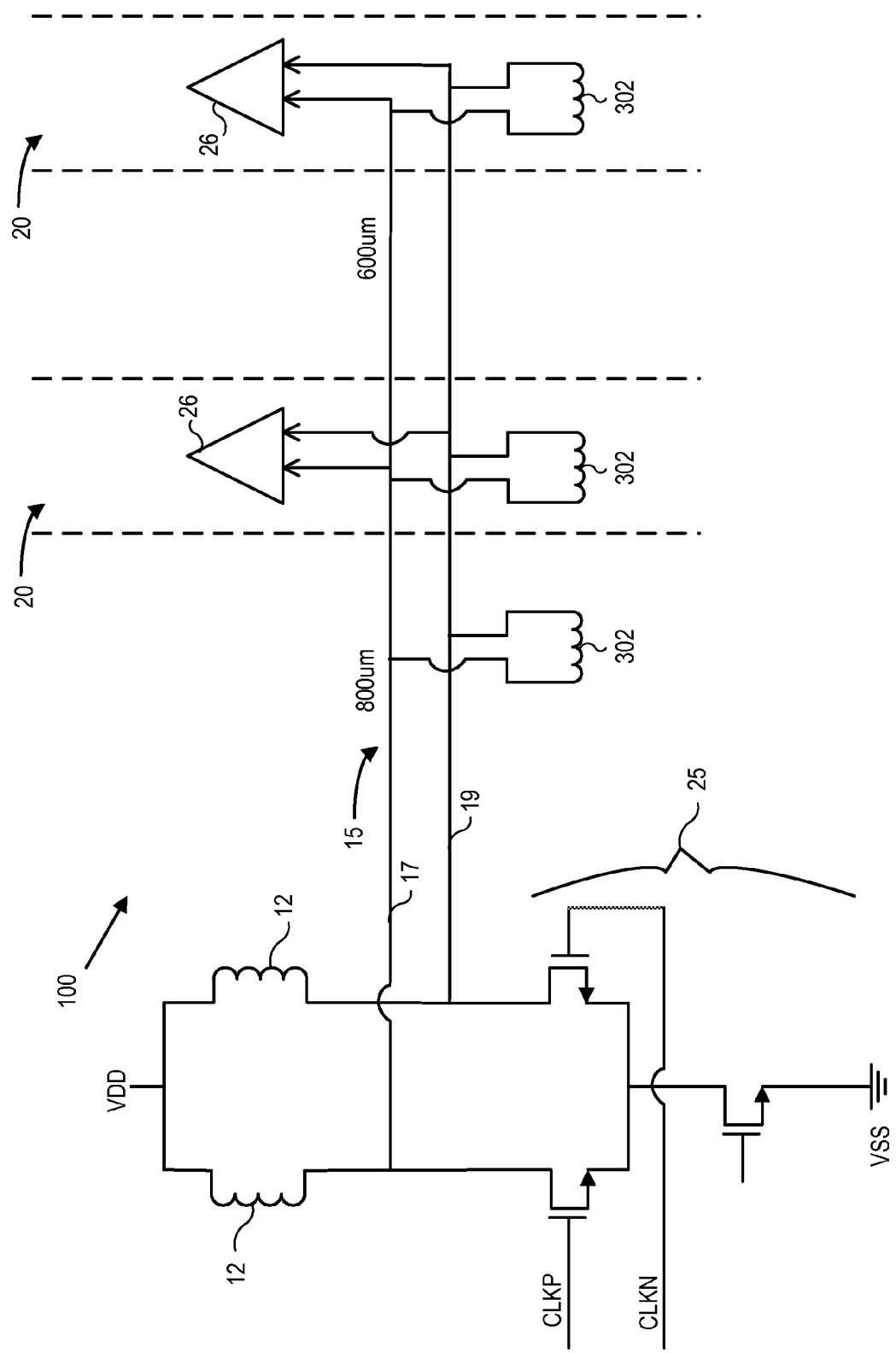
FIG. 3 is an example circuit showing a combination of the source inductor of FIG. 1 and non-VDD-connected distributed inductor(s) to drive the clock interconnect to one or more of the multiple lanes.

FIG. 3 is an example circuit 100 showing a distributed architecture 100. The distributed architecture includes, for example, distributed inductors 302 spaced along the clock interconnect 15. With use of at least more than one inductor 302, the spacing between the inductors may include any type of spacing. For instance, the spacing may be such that a distributed inductor 302 is positioned at the location of some (or all) of the lanes 20, e.g., adjacent connection of the buffers 26 into which is distributed the clock signal from the CML buffer 25. In addition or alternatively, distributed inductors 302 may be positioned at regular or irregular intervals at locations: between the lanes 20; overlapping the lanes 20 (FIG. 6); before reaching any of the lanes 20; or generally anywhere outside of the lanes 20. In some cases, distributed inductors 302 may be located at every other lane 20, or at the beginning and at the end of the clock interconnect 15.

The distributed inductors may be connected to the positive clock signal line 17 and to the negative clock signal line 19 in parallel to each other along the clock interconnect 15. In contrast to the destination inductor 52 of FIG. 2, the distributed inductors 302 are not connected to VDD and therefore are not being powered: only AC current, including the clock signal, flows down the clock interconnect 15. In another example, the destination inductors 52 may be connected to VDD. The distributed inductors 302, together with the source inductors 12, drive the clock interconnect 15 to the multiple lanes 20. Unlike the destination inductor 52 of FIG. 2, the distributed inductors 302 do not carry DC current, thus relaxing the routing requirement for electromigration (EM) requirements and eliminating a power supply at the end of the clock interconnect 15.

The distributed inductors 302 are placed along the clock interconnect 15 such as to create a resonant response in the clock signal that meets select characteristics. The select characteristics may include delivering a clock signal of substantially similar quality and amplitude into respective lanes 20. The distributed inductors 302 and/or the source inductors 12 may be variable inductors that are tunable to facilitate varying inductance of these inductors such as to adjust the desired frequency response of the clock signal within a usually narrow range. These tunable inductors may be tuned in any way, including but not limited to via a microprocessor, which may provide for closed loop or variable adjusting in real time, or may be tuned in an open loop manner such as hard coding inductance values into the design of the circuit 100. Different inductance values may be selected to configure the circuit 100 to support different modes of communication.

This clock distribution architecture 100 is therefore more robust by combining the source inductor(s) 12 with distributed inductors 302 that are not connected to DC power and are placed along the clock interconnect 15. Furthermore, because the distributed inductors 302 take on the interconnect values of the model that was previously discussed, the line inductance has little effect on the overall frequency response and amplitude along the clock interconnect 15. Eliminating the effect of the line inductance helps produce relatively similar amplitudes for each of the lanes 20.

Figure 4:
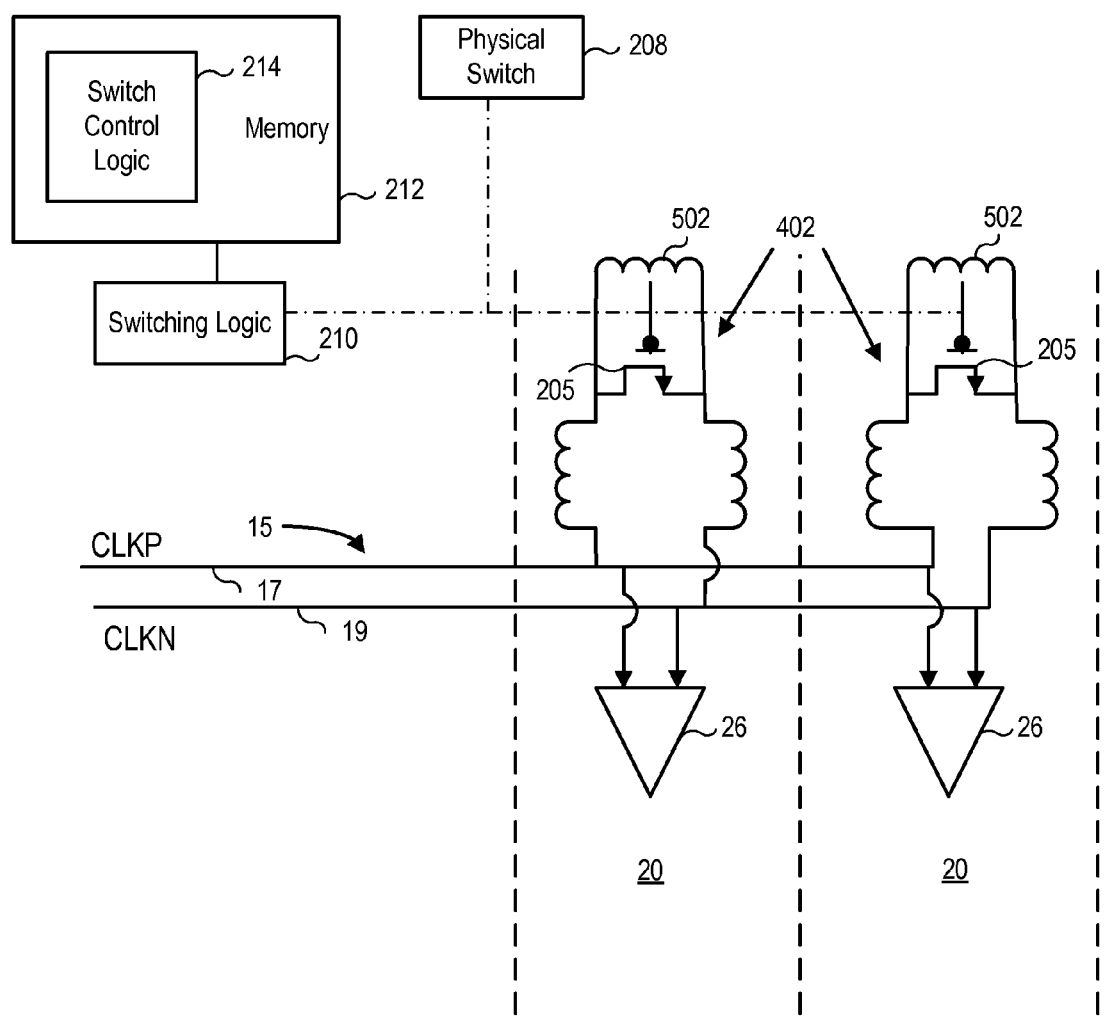
FIG. 4 shows that any of the distributed inductors of FIG. 3 may be replaced with a variable or switchable inductor to provide a larger tuning range across the lanes to support multiple communications standards, all while reducing power.

FIG. 4 shows that any of the distributed inductors 302 of FIG. 3 may be replaced with a switchable inductor 402, a specific type of a tunable inductor. While a switchable inductor 402 is shown, any type of variable or tunable inductor may be employed for the source inductors 20 and the destination inductors 302 or 402. Not all of the features of FIG. 3 are replicated in FIG. 4.

Clock distribution architecture 200 of FIG. 4 facilitates changing the inductor values at each Rx/Tx lane 20 and/or each source inductor 12. Being able to change the inductor values at one or more lanes allows for a larger tuning range while reducing power to support multiple communications standards. Because the circuit 200 employs inductors to change the frequency range, the result may include a better quality signal and amplitude when compared with use of a capacitor. A capacitor may also reduce the gain of the clock signal. Changing the inductance of the switchable inductor 402 may save power compared to sole use of a capacitor or a switchable capacitor.

Each switchable inductor 402 may include multiple inductors connected in series to each other and a switch 205 that is selectable to eliminate at least one of the series inductors, which allows the inductance to change significantly. In particular, the switch 205 is placed across the terminals of an inductor 502 so that when the switch 205 is closed, the terminals are effectively connected together and the inductor 502 is effectively removed from the circuit. The source inductors 12 may also be replaced with switchable inductors 402 so that inductance of the source inductors 12 may also be changed, depending on application and frequency tuning range requirement for such application. Use of switchable inductors 402 may be a more energy-efficient way of adjusting the clock interconnect tuning frequency than use of capacitors.

A physical switch 208 may be located so as to be accessible externally on a chip in which the circuit 100 or 200 is located. The physical switch may be switched manually and be configured to activate and control the switches 205, which adjusts the inductance of the inductors 12 and 402 to change the clock rate in support of a different mode of communication. The physical switch 208 could be a button or some other structure that controls the switches 205.

Switching logic 210 may be provided for activation and control of the switches 205 so as to control tuning the clock frequency being driven into each lane 20. The switching logic 210 may include analog logic or programmed logic. The logic may include a microcontroller, microprocessor, programmable logic chip or other logic that implements or that executes switch control logic operable to tune any of the inductors or to change any of the inductances of the switchable or tunable inductors 402. The switching logic 210 may be coupled with a memory (or storage) 212 from which the switching logic 210 executes switch control logic 214 (e.g., firmware or software program instructions) for controlling the switches 205.

The switching logic 208 may be externally controllable from outside of a chip on which the circuit 100 or 200 is located. For instance, an electronic interface may facilitate communication between an external computer that executes the switch control logic 214 and the switching logic 210 that directly controls the switches 205.

Figure 5:
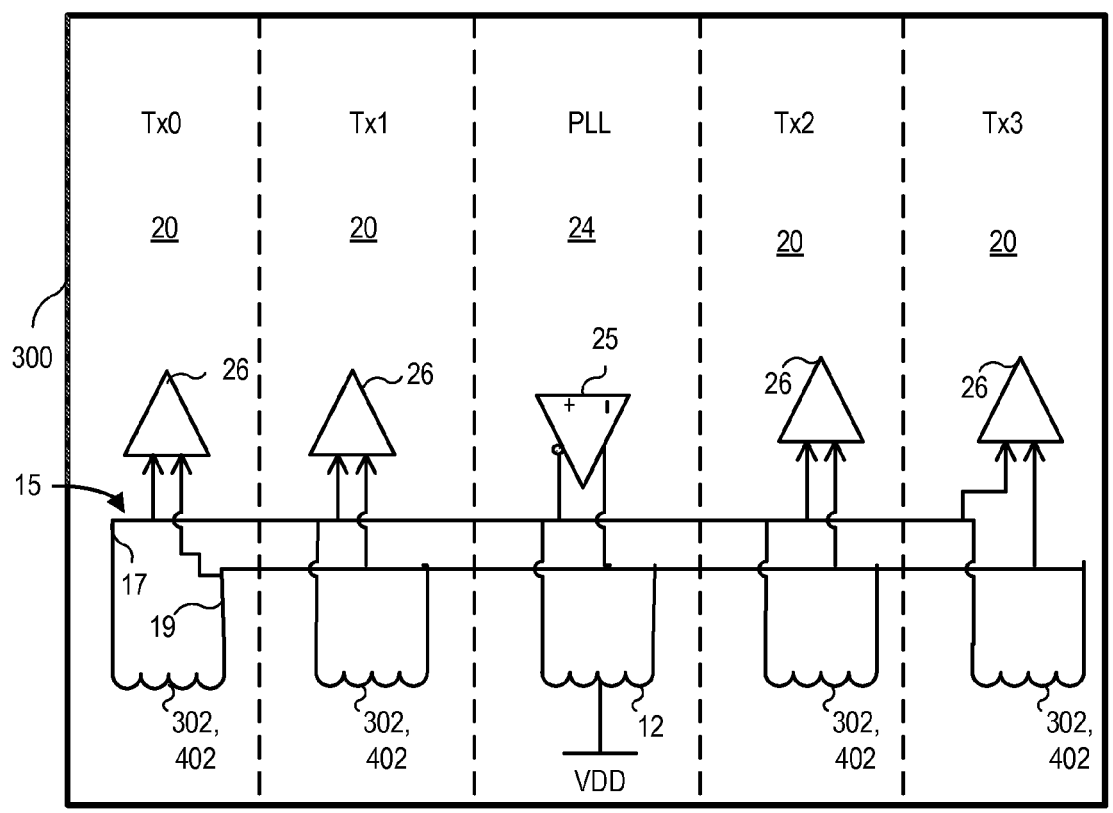
FIG. 5 is an example multiplexer using the design of FIG. 3 across four transmission (Tx) lanes of a physical layer transceiver (PHY) device, employing one distributed inductor for each lane.

FIG. 5 is an example multiplexer 300 using the design of FIG. 3 across four transmission (Tx) lanes 20 of a physical layer transceiver (PHY) device, employing one distributed inductor 302 for each lane 20. The distributed inductor 302 may be a switchable inductor 402 as disclosed with reference to FIG. 4.

The PLL 24 performs clock generation, which clock is passed through the CML buffer 25 to positive and negative clock lines of the clock interconnect 15 as shown in FIG. 3. The clock signal passing through the clock interconnect 15 is driven into respective lanes 20 by corresponding distributed or switchable inductors 302 or 402 together with the one or more source inductors 12.

The multiplexer 300, configured as a multi-rate interface, provides a robust architecture that delivers both consistent amplitude and quality of the clock signal into respective lanes 20. The architecture of the multiplexer 300 also saves power while implementing configurable clocking of the lanes 20, e.g., with a different frequency by changing the switchable inductor(s) 402 for different standards of communication that operate at different frequencies.

The memory 212 may be configured with a table (or other data structure like a database) that maps communication standards to switch settings. When a different communication standard is used, the switching logic 210 may read the table and set the switches 205 according to the mapping to implement whatever clock characteristics (such as frequency) are desired. The switching logic 210, which may be executable by a processor, may control the switchable inductors 402 according to requirements of the various communications standards from the table that are supported by the chip on which the multiplexer 300 is located. Additionally, or alternatively, the tunable and/or switchable inductors may be hard coded and thus statically set before being used at a certain frequency for a specific communication standard.

Figure 6:
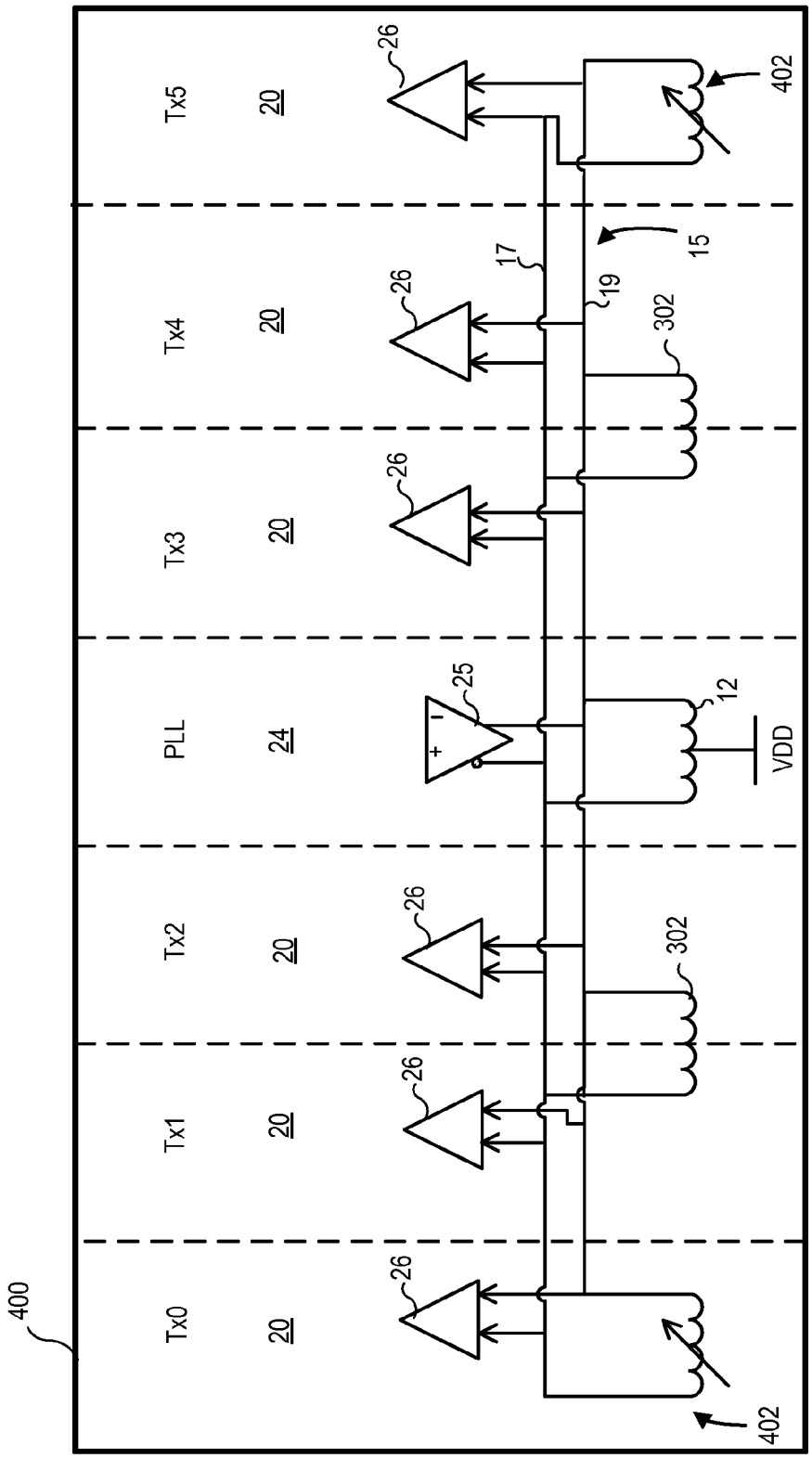
FIG. 6 is an example multiplexer using the design of FIGS. 3 and 4 across six transmission (Tx) lanes of the PHY device, employing fewer distributed inductors than there are total lanes.

FIG. 6 is an example multiplexer 400 using the design reflected in FIGS. 3 and 4 across six transmission (Tx) lanes 20 of a PHY (or similar) device, employing fewer distributed inductors 302 or 402 than there are total lanes 20. The circuit 400 of FIG. 6 combines designs related to the circuit architectures 100, 200 and 300. The distributed inductors 302 may be located between or overlapping the Tx lanes 20. Some of the distributed inductors 302 may be switchable inductors 402 as discussed with reference to FIG. 4. As can be seen from FIG. 6, any number of designs is possible within the principles of the present disclosure.

Space available within the design on the physical layout of the integrated circuit may dictate how many distributed inductors can be used and where they can be placed along the clock interconnect 15. Accordingly, using tuning or switchable inductors may help to tune the resonant response of the clock signal down the clock interconnect 15, to provide consistent amplitude and a good quality clock signal the length of the clock interconnect 15 regardless of placement. Where desired, the switchable inductors 402 can also be configured to alter the frequency of the clock signal, to support multiple communication standards.

The lower power clock distribution as described with reference to example circuits 100 through 400 provide significant power savings of over a 100 percent when compared with a broadband solution, and on the order of 50 percent or more when compared to other tuned structures. With regard to the latter, to maintain a high level of performance and signal quality power savings, these other tuned architectures have limited drive distance and would require multiple buffer inserts along the path, further complicating modeling of the frequency response.

The example circuits 100 through 400 also take up a smaller area than when executing transmission line routing. They also provide a larger tuning range while maintaining stringent performance requirements with reference to amplitude and harmonic distortion. These architectural advantages increase as clock rates increase and/or routing distances become longer.

Figure 7A:
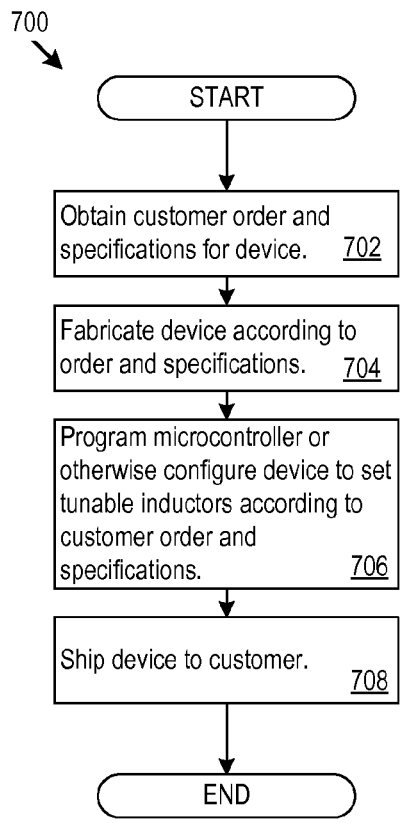
FIG. 7A shows an example flow diagram for delivering a device, including the architecture of any of FIGS. 3-6, according to customer specifications.

FIG. 7A shows an example flow diagram 700 for delivering a device, including the architecture of any of FIGS. 3-6, according to customer specifications. The manufacturer obtains a customer order and specifications for a device (702). The specifications may include a communications standard that the device should adhere to. The manufacturer obtains (e.g., by fabricating) the device according to the order and the specifications (704). In addition, the manufacturer programs a microcontroller or otherwise configures the device to set the tunable inductors (e.g., via the switching shown in FIG. 4) according to the customer order and the specifications (706). This configuration may tune the clock rate of the device to support the specified communications standard with substantially similar quality and amplitude to all lanes 20. The manufacturer then ships the device to the customer (708).

Figure 7B:
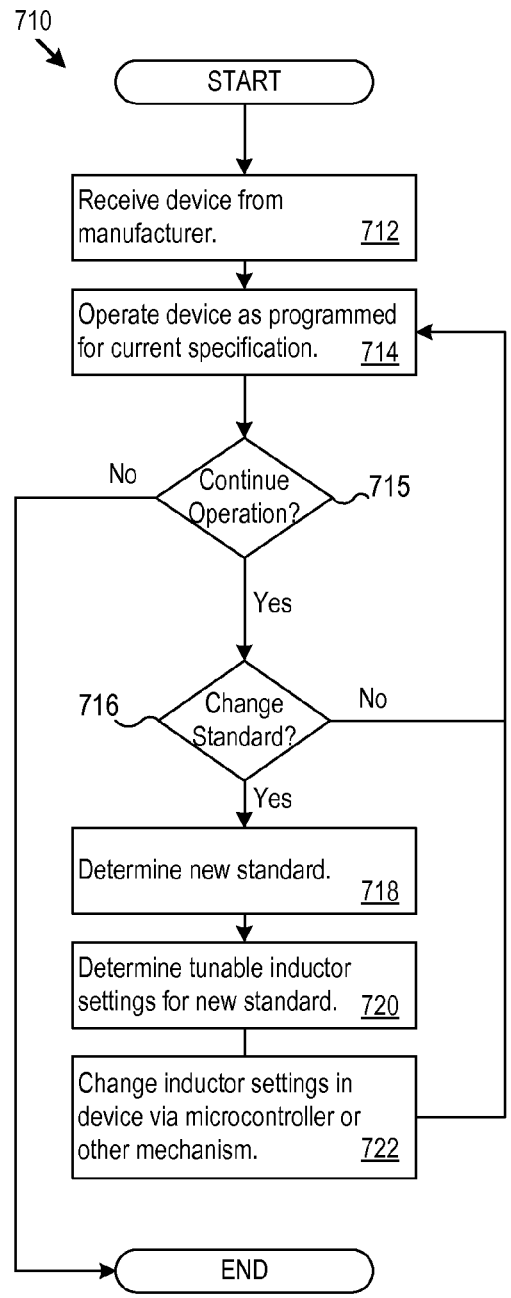
FIG. 7B shows an example flow diagram for operating the device received from the manufacturer, including adjusting tunable inductors for a customer-selected communication standard.

FIG. 7B shows an example flow diagram 710 for operating the device received from the manufacturer, including adjusting tunable inductors for a customer-selected communication standard. The customer receives the device from the manufacturer (712) and operates the device as programmed for the current specification (714). The device operation may continue as long as desired (715). At any point in time, the device may change to support, e.g., a different communications standard under which the device operates (716).

Accordingly, a different communication standard may be determined (718). The different communication standard may determine the configuration settings, e.g., the tunable inductor settings, for configuring the device to meet the new standard (720). The configuration settings are communicated to the device, which changes the inductor settings via a microcontroller or other programming or switching logic (722), for example as described with respect to FIG. 4. The change in configuration tunes the clock rate at the lanes 20 to a frequency of the new communications standard. The device may continue to operate under the new configuration settings for as long as desired (714).

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A clock driver comprising:
   a clock interconnect running to multiple lanes of an integrated circuit chip, the clock interconnect including a positive clock line and a negative clock line;
   a clock generator that generates a clock signal;
   a source inductor through which the clock generator draws power to drive the clock signal down the clock interconnect, where the clock signal has a resonant response; and
   multiple distributed inductors connected to and positioned along the positive and negative clock lines between the source inductor and an end of the clock interconnect to tune the resonant response down the clock interconnect to achieve a pre-determined quality goal for the clock signal as delivered to respective lanes.

2. The clock driver of claim 1, where at least one of the distributed inductors is positioned adjacent where the clock interconnect is delivered to at least one of the multiple lanes.

3. The clock driver of claim 2, where the positive and negative clock lines connect to the respective lanes through buffers.

4. The clock driver of claim 1, where the clock generator comprises a phase-locked loop (PLL) circuit and a current-mode logic (CML) buffer.

5. The clock driver of claim 1, where at least one of the distributed inductors carries Alternating Current (AC) current, including the clock signal.

6. The clock driver of claim 1, where at least one of the distributed inductors comprises a tuning inductor having a variable inductance to adjust a frequency of the clock signal.

7. The clock driver of claim 1, where the source inductor comprises a tuning inductor having a variable inductance to adjust a frequency of the clock signal.

8. A clock driver comprising:
   a clock interconnect running to multiple lanes of an integrated circuit chip, the clock interconnect including a positive clock line and a negative clock line;
   a source inductor through which a clock generator buffer draws power to drive the clock signal down the clock interconnect, where the clock signal has a resonant response; and
   multiple tunable inductors connected to and positioned along the positive and negative clock lines between the source inductor and an end of the clock interconnect, the tunable inductors having a variable inductance and are positioned and tuned to tune the resonant response of the clock signal down the clock interconnect to achieve a predetermined quality goal for the clock signal along the clock interconnect.

9. The clock driver of claim 8, where at least one of the tunable inductors is positioned where the clock interconnect is delivered to at least one of the multiple lanes.

10. The clock driver of claim 8, where at least one of the tunable inductors is connected to the clock interconnect where it connects to at least one of the lanes.

11. The clock driver of claim 8, where at least one of the tunable inductors comprises a switchable inductor, the switchable inductor comprising:
    a series of inductors; and
    a switch to short out at least one of the inductors in the series of inductors to extend a tuning range of inductance to support multiple communications standards across the multiple lanes.

12. The clock driver of claim 11, further comprising:
    a switch controller configured to control the switch to adapt the clock signal to a specific communication standard; and
    a memory including switch control logic for execution by the switch controller.

13. The clock driver of claim 11, where the source inductor comprises a switchable inductor.

14. A clock driver comprising:
    a clock interconnect running to multiple lanes of an integrated circuit chip, the clock interconnect including a positive clock line and a negative clock line;
    a clock generator configured to generate a clock signal;
    a source inductor through which the clock generator draws power to drive the clock signal down the clock interconnect, where the clock signal has a resonant response; and multiple variable inductors connected to and positioned along the positive and negative clock lines between the source inductor and an end of the clock interconnect, the variable inductors being settable with an inductance to tune the resonant response down the clock interconnect to achieve a predetermined quality goal for the clock signal along the clock interconnect, in resonse to changing a frequency of the clock signal.

15. The clock driver of claim 14, wherein the variable inductors are positioned along the clock interconnect to maximize quality and amplitude of the clock signal delivered to the multiple lanes.

16. The clock driver of claim 14, where at least one of the variable inductors comprises a tunable inductor.

17. The clock driver of claim 14, further comprising a switch controller in communication with a particular variable inductor among the variable inductors.

18. The clock driver of claim 17, where the switch controller is configured to adjust the particular variable inductor.

19. The clock driver of claim 17, where the switch controller is configured to adjust the particular variable inductor to adapt the clock signal for a particular communication requirement.

20. The clock driver of claim 19, where the switch controller is configured to select among multiple different communication standards, to determine the communication requirement, for adapting the clock signal.

* * * * *

UNITED STATES PATENT AND TRADEMARK OFFICE
CERTIFICATE OF CORRECTION

PATENT NO.         : 8,791,742 B2
APPLICATION NO.    : 13/622223
DATED              : July 29, 2014
INVENTOR(S)        : Adesh Garg et al.

It is certified that error appears in the above-identified patent and that said Letters Patent is hereby corrected as shown below:

In the Claims

In column 9, claim 14, line 7, after "interconnect, in" replace "resonse" with --response--.

Signed and Sealed this
Fourteenth Day of October, 2014

Michelle K. Lee
*Deputy Director of the United States Patent and Trademark Office*